(12) United States Patent
Bang et al.

(10) Patent No.: US 11,424,300 B2
(45) Date of Patent: Aug. 23, 2022

(54) DISPLAY APPARATUS

(71) Applicant: SAMSUNG DISPLAY CO., LTD., Yongin-si (KR)

(72) Inventors: Kiho Bang, Yongin-si (KR); Yonghwan Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/033,735

(22) Filed: Sep. 26, 2020

(65) Prior Publication Data
US 2021/0175292 A1 Jun. 10, 2021

(30) Foreign Application Priority Data

Dec. 6, 2019 (KR) .................. 10-2019-0161667

(51) Int. Cl.
*H01L 27/32* (2006.01)
*H01L 51/52* (2006.01)
*G06F 3/041* (2006.01)

(52) U.S. Cl.
CPC .......... *H01L 27/323* (2013.01); *G06F 3/0412* (2013.01); *G06F 3/0416* (2013.01); *H01L 51/5253* (2013.01); *H01L 27/3246* (2013.01); *H01L 27/3258* (2013.01)

(58) Field of Classification Search
CPC ... G06F 3/0412; G06F 3/0416; H01L 27/323; H01L 27/3246; H01L 27/3258; H01L 51/5253
See application file for complete search history.

(56) References Cited

U.S. PATENT DOCUMENTS

| 10,340,317 | B2 | 7/2019 | Oh et al. |
| 10,572,057 | B2 | 2/2020 | Lee et al. |
| 10,608,958 | B2 | 3/2020 | Gwon et al. |
| 2018/0033831 | A1 | 2/2018 | An et al. |
| 2018/0366520 | A1* | 12/2018 | Gwon .................. G06F 3/0412 |
| 2019/0019966 | A1* | 1/2019 | Jiang .................. H01L 27/3276 |

(Continued)

FOREIGN PATENT DOCUMENTS

| KR | 10-1866395 | 6/2018 |
| KR | 10-2018-0074139 | 7/2018 |

(Continued)

*Primary Examiner* — Temesghen Ghebretinsae
*Assistant Examiner* — Sosina Abebe
(74) *Attorney, Agent, or Firm* — F. Chau & Associates, LLC

(57) ABSTRACT

A display apparatus includes a thin-film encapsulation layer covering pixel on a substrate and including a first inorganic encapsulation layer, an organic encapsulation layer, and a second inorganic encapsulation layer having a different length from that of the first inorganic encapsulation layer, a touch electrode located on the thin-film encapsulation layer, a touch contact line spaced apart from the thin-film encapsulation layer and located outside the thin-film encapsulation layer, an insulating layer located on the touch contact line, a touch contact hole formed in the insulating layer and spaced apart from the thin-film encapsulation layer, and a touch connection line extending from the touch electrode toward the touch contact hole and connected to the touch contact line through the touch contact hole.

15 Claims, 9 Drawing Sheets

(56) References Cited

U.S. PATENT DOCUMENTS

2021/0126067 A1* 4/2021 Xu ..................... H01L 27/3253
2021/0165517 A1* 6/2021 Lee ..................... G06F 3/0443

FOREIGN PATENT DOCUMENTS

KR   10-2018-0136082   12/2018
KR       10-1926527   12/2018
KR   10-2019-0023866    3/2019

* cited by examiner

DISPLAY APPARATUS

CROSS-REFERENCE TO RELATED APPLICATION

This application claims the benefit of Korean Patent Application No. 10-2019-0161667, filed on Dec. 6, 2019, in the Korean Intellectual Property Office, the disclosure of which is incorporated by reference herein in its entirety.

BACKGROUND

1. Field

The present inventive concept relates to a display apparatus, and more particularly, to a display apparatus including a touch-screen layer.

2. Description of Related Art

A display apparatus is an apparatus which visually displays data. A display apparatus includes a display area including pixels and a non-display area in which non-display elements such as a terminal portion, a driving circuit, or the like are arranged around the display area. In addition, a touch-screen layer including a touch electrode may be further arranged in the display area, and a touch connection line connected to the touch-screen layer and a touch contact line in contact with the touch connection line may be further arranged in the non-display area.

When the touch connection line and the touch contact line connected to the touch-screen layer are further arranged in the non-display area, a dead space in which an image is not displayed may increase.

SUMMARY

One or more embodiments include a display apparatus, in which a dead space in a non-display area may be minimized. However, these problems are exemplary, and the scope of the present disclosure is not limited thereto.

Additional aspects will be set forth in part in the description which follows and, in part, will be apparent from the description, or may be learned by practice of the presented embodiments of the disclosure.

According to an embodiment, a display apparatus includes a thin-film encapsulation layer covering pixel on a substrate and including a first inorganic encapsulation layer, an organic encapsulation layer, and a second inorganic encapsulation layer having a different length from that of the first inorganic encapsulation layer, a touch electrode located on the thin-film encapsulation layer, a touch contact line spaced apart from the thin-film encapsulation layer and located outside the thin-film encapsulation layer, an insulating layer located on the touch contact line, a touch contact hole formed in the insulating layer and spaced apart from the thin-film encapsulation layer, and a touch connection line extending from the touch electrode toward the touch contact hole and connected to the touch contact line through the touch contact hole.

According to an embodiment, an end portion of the second inorganic encapsulation layer may be located closer to the touch contact line than an end portion of the first inorganic encapsulation layer.

According to an embodiment, the first inorganic encapsulation layer may be thicker than the second inorganic encapsulation layer.

According to an embodiment, an end portion of the first inorganic encapsulation layer may be located closer to the touch contact line than an end portion of the second inorganic encapsulation layer.

According to an embodiment, the second inorganic encapsulation layer may be thicker than the first inorganic encapsulation layer.

According to an embodiment, the display apparatus further includes a first touch insulating layer and a second touch insulating layer. The second touch insulation layer is disposed on a first portion of the first touch insulating layer. The touch electrode comprises a first touch conductive layer and a second touch conductive layer. The first portion of the first touch insulating layer is disposed between the first touch conductive layer and the second touch conductive layer. A second portion of the first touch insulating layer is disposed between the touch contact line and the touch connection line. The second touch insulating layer is disposed on the second touch conductive layer.

According to an embodiment, the insulating layer may extend from the first touch insulating layer.

According to an embodiment, the first touch insulating layer may include an inorganic insulating material.

According to an embodiment, the touch connection line extends from the second touch conductive layer toward the touch contact hole so that the touch connection line is in contact with the touch contact line.

According to an embodiment, the touch connection line extends from the first touch conductive layer toward the touch contact hole so that the touch connection line is in contact with the touch contact line.

According to an embodiment, the touch connection line includes a first touch connection line extending from the first touch conductive layer toward the touch contact hole so that the touch connection line is in contact with the touch contact line, and a second touch connection line extending from the second touch conductive layer toward the touch contact hole. The first touch insulating layer is interposed between the first touch connection line and the second touch connection line.

According to an embodiment, the display apparatus further includes a transistor on the substrate, a planarization film covering the transistor and the substrate, the planarization film including an organic insulating material, and a pixel-defining film located on the planarization film and comprising an organic insulating material. The pixel-defining film is disposed between the planarization film and the thin-film encapsulation layer. The insulating layer includes the same material as that of the planarization film and the pixel-defining film.

According to an embodiment, the touch connection line may cover upper surfaces and end portions of the first inorganic encapsulation layer and the second inorganic encapsulation layer.

According to an embodiment, the display apparatus further includes a driving voltage line electrically connected to pixel, a first dam portion positioned to overlap the driving voltage line and a second dam portion partially overlapping the driving voltage line. The second dam portion is disposed between the first dam portion and the touch contact line.

According to an embodiment, an end portion of the first inorganic encapsulation layer is located on an upper surface of the second dam portion and an end portion of the second inorganic encapsulation layer is located between a sidewall of the second dam portion and the touch contact line.

According to an embodiment, end portions of the first inorganic encapsulation layer and the second inorganic encapsulation layer may be located between the second dam portion and the touch contact line.

According to an embodiment, A display apparatus includes a thin-film encapsulation layer covering an organic light-emitting element on a substrate and including a first inorganic encapsulation layer, an organic encapsulation layer, and a second inorganic encapsulation layer, a touch electrode located on the thin-film encapsulation layer, and a touch contact line spaced apart from the thin-film encapsulation layer, located outside the thin-film encapsulation layer, and electrically connected to a touch connection line extending the touch electrode. The first inorganic encapsulation layer is thicker than the second inorganic encapsulation layer. An end portion of the second inorganic encapsulation layer is located closer to the touch contact line than an end portion of the first inorganic encapsulation layer.

According to an embodiment, the display apparatus further includes a first dam portion disposed under an end portion of the organic encapsulation layer of the thin-film encapsulation layer, the first inorganic encapsulation layer and the second inorganic encapsulation layer meeting each other at an upper surface of the first dam portion, and a second dam portion located outside the first dam portion. The second dam portion is between the first dam portion and the touch contact line.

According to an embodiment, end portions of the first inorganic encapsulation layer and the second inorganic encapsulation layer are located between the first dam portion and the touch contact line.

According to an embodiment, end portions of the first inorganic encapsulation layer and the second inorganic encapsulation layer may be located between the second dam portion and the touch contact line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
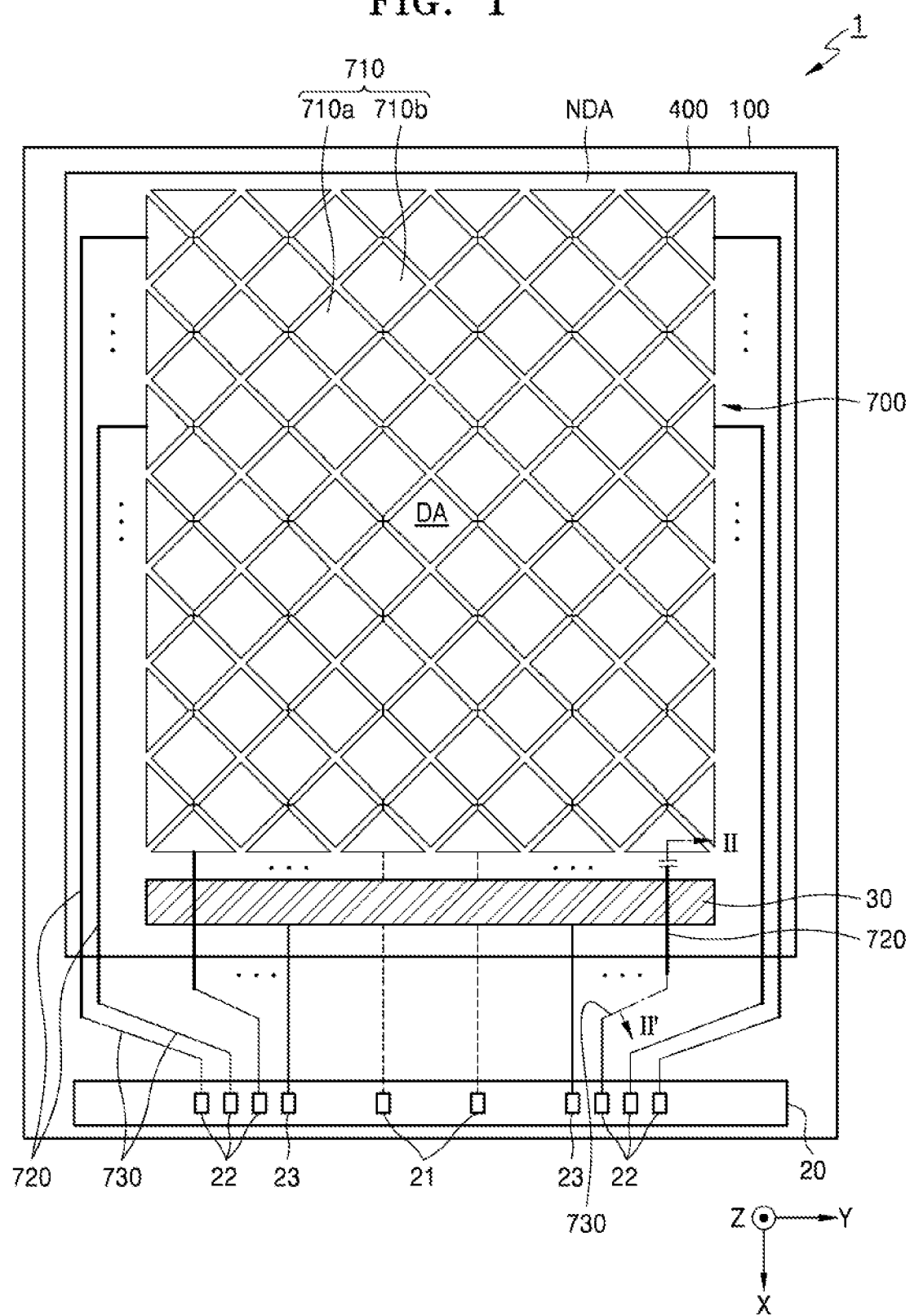
FIG. 1 is a schematic plan view of a display apparatus according to an exemplary embodiment of the present inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Effects and features of the present disclosure and methods of achieving the same will be apparent with reference to embodiments and drawings described below in detail. The present disclosure may, however, be embodied in many different forms and should not be construed as being limited to the exemplary embodiments set forth herein.

The disclosure will now be described more fully with reference to the accompanying drawings, in which embodiments of the disclosure are shown. Like reference numerals in the drawings denote like elements, and thus their description will be omitted.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. For example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. For example, intervening layers, regions, or components may be present. For example, it will be understood that when a layer, region, or component is referred to as being electrically connected to another layer, region, or component, it can be directly or indirectly electrically connected to the other layer, region, or component. For example, intervening layers, regions, or components may be present.

The x, y, and z rows are not limited to three rows on the orthogonal coordinates system, and may be interpreted in a broad sense including the same. For example, the x, y, and z rows may be orthogonal to one another, but may refer to different directions that are not orthogonal to one another.

A display apparatus is an apparatus displaying an image, and may include a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, or the like.

Hereinafter, although an organic light-emitting display apparatus is described as an example of a display apparatus according to an embodiment, the display apparatus of the present disclosure is not limited thereto, and various types of display apparatuses may be used.

Figure 2:
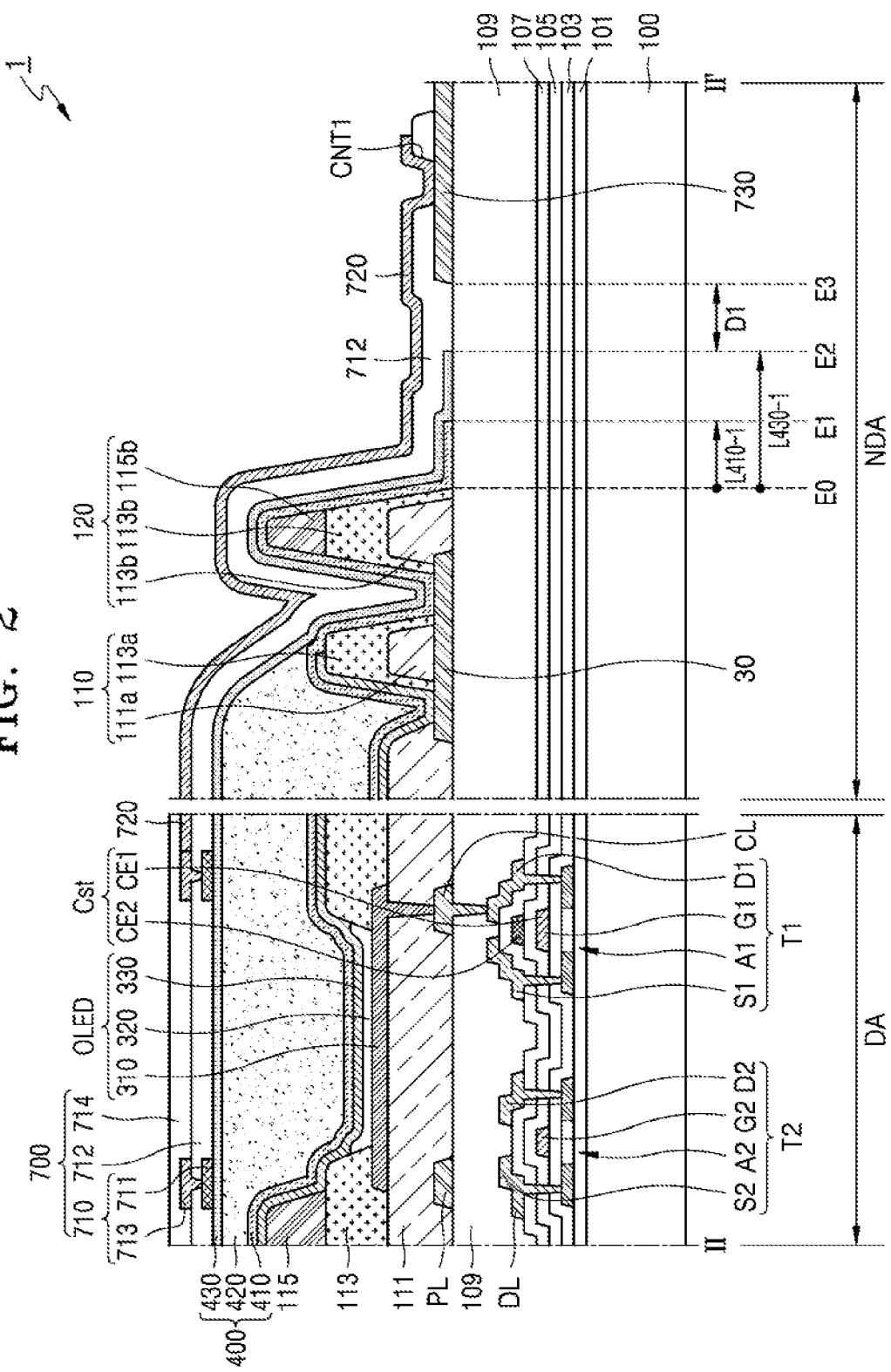
FIG. 2 is a cross-sectional view of the display apparatus taken along line II-II' of FIG. 1 according to an exemplary embodiment of the present inventive concept.

FIG. 1 is a schematic plan view of a display apparatus 1 according to an embodiment, and FIG. 2 is a cross-sectional view of the display apparatus 1 taken along line II-II' of FIG. 1.

Referring to FIG. 1, the display apparatus 1 includes a display area DA providing an image through light emitted from a plurality of pixels located on a substrate 100, and a non-display area NDA in which pixels are not arranged and an image is not provided. Each pixel may include an organic light-emitting element.

Although FIG. 1 illustrates that the substrate 100 includes a rectangular shape, the substrate 100 may include various shapes, such as a circular shape, an elliptical shape, a polygonal shape, or the like.

The display area DA on the substrate 100 may be sealed with a thin-film encapsulation layer 400, and a touch-screen layer 700 may be arranged on the thin-film encapsulation layer 400.

Although not illustrated in FIG. 1, elements such as a thin-film transistor, an organic light-emitting element, a capacitor, or the like may be included in the display area DA.

The display area DA may further include signal lines configured to transmit pulse signals, such as a gate line configured to transmit a gate signal and a data line configured to transmit a data signal, and configured to transmit a direct current signal of a driving power line, a common power line, or the like. An image may be displayed in a pixel by electrical coupling of a thin-film transistor, a capacitor, an organic light-emitting element or the like which are connected to the gate line, the data line, the driving power line, and the common power line.

The display area DA may include a plurality of pixels that are arranged in various forms, such as a stripe arrangement, a pentile arrangement, or the like.

The thin-film encapsulation layer 400 may cover a display element or the like arranged in the display area DA to protect the display element or the like from external moisture or oxygen. The thin-film encapsulation layer 400 may cover the display area DA and may cover a portion of the non-display area NDA.

The touch-screen layer 700 including a touch electrode 710 in various patterns for a touch function may be arranged on the thin-film encapsulation layer 400.

The touch electrode 710 may include first touch electrodes 710a connected to each other in a first direction X and second touch electrodes 710b connected to each other in a second direction Y crossing the first direction X.

The touch electrode 710 may include a transparent electrode material such that light emitted from an emission area of the pixels arranged under the touch-screen layer 700 may be transmitted.

Alternatively, the touch electrode 710 may have a mesh shape such that light emitted from the emission area of the pixels may be transmitted. When the touch electrode 710 has a mesh shape, the touch electrode 710 does not need to include the transparent electrode material. For example, the touch electrode 710 may be a single-layered film or a multi-layered film including a conductive material including aluminum Al, copper Cu, and/or titanium Ti, or the like.

The touch electrode 710 may be connected to a second touch connection line 720 configured to transmit a signal sensed by the touch electrode 710, and the second touch connection line 720 may extend from an upper portion of the thin-film encapsulation layer 400 to the non-display area NDA along one side of the thin-film encapsulation layer 400.

A portion of the thin-film encapsulation layer 400, a driving voltage supply line 30, a plurality of second touch connection lines 720, touch contact lines 730, a terminal portion 20, or the like may be arranged in the non-display area NDA.

The terminal portion 20 is arranged at one end portion of the non-display area NDA and includes a plurality of terminals 21, 22, and 23. The terminal portion 20 may be exposed without being covered by an insulating layer, and may be electrically connected to a controller (not shown) such as a flexible printed circuit board, a driver integrated circuit (IC), or the like.

The controller may change a plurality of image signals transmitted from the outside into a plurality of image data signals and transmit the changed image data signals to the display area DA through a first terminal 21. The controller may receive a signal sensed by the touch-screen layer 700 or transmit a touch control signal to the touch-screen layer 700 through a second terminal 22. The controller may provide a driving voltage ELVDD to the pixels through a third terminal 23.

Although not illustrated in FIG. 1, a common voltage supply line configured to provide a common voltage ELVSS to each pixel, a scan driver configured to provide a scan signal to each pixel, a data driver configured to provide a data signal to each pixel, or the like, may be further arranged in the non-display area NDA.

Referring to the display area DA of FIG. 2, a buffer layer 101 is arranged on the substrate 100, and a driving thin-film transistor T1, a switching thin-film transistor T2, and a storage capacitor Cst are arranged on the buffer layer 101.

The substrate 100 may include various materials such as glass, metal, plastic, or the like. For example, the substrate 100 may be a flexible substrate including a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or the like. Although FIG. 2 illustrates a substrate having a single-layer structure, the substrate 100 may include a single-layered structure or a multi-layered structure.

The buffer layer 101 including silicon oxide ($SiO_x$) and/or silicon nitride ($SiN_x$) or the like may be formed on the substrate 100 to prevent from penetration of impurities.

The driving thin-film transistor T1 may include a driving semiconductor layer A1 and a driving gate electrode G1, and the switching thin-film transistor T2 may include a switching semiconductor layer A2 and a switching gate electrode G2. A first gate insulating layer 103 is arranged between the driving semiconductor layer A1 and the driving gate electrode G1 and between the switching semiconductor layer A2 and the switching gate electrode G2. The first gate insulating layer 103 may include an inorganic insulating material, such as silicon oxide ($SiO_x$), silicon nitride ($SiN_x$), silicon oxynitride (SiON), or the like.

The driving semiconductor layer A1 and the switching semiconductor layer A2 may include amorphous silicon or polycrystalline silicon. In an embodiment, the driving semiconductor layer A1 and the switching semiconductor layer A2 may include an oxide of at least one materials selected from a group including indium (In), gallium (Ga), stanium (Sn), zicronium (Zr), vanadium (V), hafnium (Hf), cadmium (Cd), germanium (Ge), chromium (Cr), titanium (Ti), and zinc (Zn).

The driving semiconductor layer A1 may include a driving channel area overlapping the driving gate electrode G1 and not doped with impurities, and a driving source area and a driving drain area respectively arranged on opposite sides of the driving channel area and doped with impurities. The driving source area and the driving drain area may be respectively connected to a driving source electrode S1 and a driving drain electrode D1.

The switching semiconductor layer A2 may include a switching channel area that overlaps the switching gate electrode G2 and is not doped with impurities, a switching source area and a switching drain area respectively arranged on opposite sides of the switching channel area and doped with impurities. The switching source area and the switching drain area may be respectively connected to a switching source electrode S2 and a switching drain electrode D2.

The driving gate electrode G1 and the switching gate electrode G2 may include molybdenum (Mo), Al, Cu, Ti, or the like, and may include a single-layered film or a multi-layered film.

In some embodiments, the storage capacitor Cst may be arranged to overlap the driving thin-film transistor T1. In this case, areas of the storage capacitor Cst and the driving thin-film transistor T1 may be increased, and a high-quality image may be provided. For example, the driving gate electrode G1 may be a first storage capacitor plate CE1 of the storage capacitor Cst. A second storage capacitor plate CE2 may overlap the first storage capacitor plate CE1 with a second gate insulating layer 105 between the first storage capacitor plate CE1 and the second storage capacitor plate CE2. The second gate insulating layer 105 may include an inorganic insulating material, such as silicon oxide ($SiO_x$), silicon nitride ($SiN_x$), silicon oxynitride (SiON), or the like.

An interlayer insulating layer 107 may cover the storage capacitor Cst. A first planarization film 109 may be disposed on the interlayer insulating layer 107 and cover the driving thin-film transistor T1, the switching thin-film transistor T2.

The interlayer insulating layer 107 may include an inorganic material layer such as silicon oxynitride (SiON), silicon oxide ($SiO_x$), and/or silicon nitride ($SiN_x$).

A data line DL may be arranged on the interlayer insulating layer 107, and the data line DL is connected to the switching semiconductor layer A2 of the switching thin-film transistor T2 through a contact hole penetrating the interlayer insulating layer 107. The data line DL may function as the switching source electrode S2.

The driving source electrode S1, the driving drain electrode D1, the switching source electrode S2, and the switching drain electrode D2 may be arranged on the interlayer insulating layer 107, and may be connected to the driving semiconductor layer A1 or the switching semiconductor layer A2 through the contact hole penetrating the interlayer insulating layer 107.

The data line DL, the driving source electrode S1, the driving drain electrode D1, the switching source electrode S2, and the switching drain electrode D2 may be covered by an inorganic protective layer (not shown).

The inorganic protective layer (not shown) may be a single-layered film or a multi-layered film of silicon nitride ($SiN_x$) and silicon oxide ($SiO_x$). The inorganic protective layer (not shown) may prevent some lines exposed in the non-display area NDA, for example, lines formed together with the data line DL in the same operation, from being damaged by an etchant used when patterning a pixel electrode 310.

A driving voltage line PL may be arranged on a different layer from the data line DL. The first planarization film 109 may be located between the driving voltage line PL and the data line DL, and the driving voltage line PL may be covered by a second planarization film 111.

The driving voltage line PL may include a single-layered film or a multi-layered film including at least one of Al, Cu, Ti, and an alloy thereof. In an embodiment, the driving voltage line PL may include a three-layer film of Ti/Al/Ti.

Although FIG. 2 illustrates a structure in which the driving voltage line PL is arranged on the first planarization film 109, the present disclosure is not limited thereto. In an embodiment, the driving voltage line PL may be connected to a lower additional voltage line (not shown) formed on the same layer as the data line DL through a contact hole (not shown) formed in the first planarization film 109 and may reduce resistance.

The first planarization film 109 and the second planarization film 111 may include a single-layered film or a multi-layered film.

The first planarization film 109 and the second planarization film 111 may include an organic insulating material. For example, the organic insulating material may include an imide polymer, a general commercial polymer such as poly(methyl methacrylate) (PMMA) or polystyrene (PS), a polymer derivative having a phenol group, an acrylic polymer, an aryl ether polymer, an amide polymer, a fluorine polymer, a p-xylene polymer, a vinyl alcohol polymer, or the like.

The present invention is not limited thereto. In an embodiment, the first planarization film 109 and the second planarization film 111 may include an inorganic insulating material. For example, the inorganic insulating material may include silicon oxynitride (SiON), silicon oxide ($SiO_x$), silicon nitride ($SiN_x$), or the like.

A pixel may include a light-emitting element such as an organic light-emitting element OLED and an inorganic light-emitting element. The inorganic light-emitting element may include quantum dot light-emitting diodes. For the convenience of description, it is assumed that the pixel includes the organic light-emitting element OLED including the pixel electrode 310, an opposite electrode 330, and an intermediate layer 320 located between the pixel electrode 310 and the opposite electrode 330. The intermediate layer 320 may include an emission layer. The organic light-emitting element OLED may be located on the second planarization film 111.

The pixel electrode 310 may be connected to a connection line CL formed on the first planarization film 109, and the connection line CL may be connected to the driving drain electrode D1 of the driving thin-film transistor T1.

The pixel electrode 310 may include a transparent electrode or a semi-transparent electrode.

When the pixel electrode 310 includes a transparent electrode, the pixel electrode 310 may include a transparent conductive layer. The transparent conductive layer may include at least one selected from a group including indium tin oxide (ITO), indium zinc oxide (IZO), zinc oxide (ZnO), indium oxide ($In_2O_3$), indium gallium oxide (IGO), and aluminum zinc oxide (AZO). In this case, in addition to the transparent conductive layer, a semi-transmissive layer configured to increase the light efficiency may be further included, and the semi-transmissive layer may include a thin film of several to several tens of micrometers($\mu$m) including at least one selected from a group including silver (Ag), magnesium (Mg), Al, platinum (Pt), palladium (Pd), gold (Au), nickel (Ni), neodymium (Nd), iridium (Ir), chromium (Cr), lithium (Li), calcium (Ca), and ytterbium (Yb).

When the pixel electrode 310 includes a reflective electrode, the pixel electrode 310 may include a reflective film including Ag, Mg, Al, Pt, Pd, Au, Ni, Nd, Ir, Cr, and a compound thereof, and a transparent conductive layer arranged above and/or below the reflective film. The transparent conductive layer may include at least one selected from a group including ITO, IZO, ZnO, $In_2O_3$, IGO, and AZO.

However, the present disclosure is not limited thereto. The pixel electrode 310 may include various materials, and a structure thereof may be variously modified, such as a single-layered film or a multi-layered film.

A pixel-defining film 113 may be arranged on the pixel electrode 310.

The pixel-defining film 113 defines a pixel by forming an opening exposing the pixel electrode 310. In addition, the pixel-defining film 113 may prevent an arc from being generated at an edge portion of the pixel electrode 310 by increasing a distance between an edge of the pixel electrode 310 and the opposite electrode 330. The pixel-defining film 113 may include, for example, an organic material, such as polyimide, hexamethyldisiloxane (HMDSO), or the like.

The intermediate layer 320 may include a low-molecular-weight material or a polymer material.

When the intermediate layer 320 includes the low-molecular-weight material, the intermediate layer 320 may include a structure in which a hole injection layer, a hole transport layer, an emission layer, an electron transport layer, an electron injection layer, or the like are stacked. The intermediate layer 320 may include various organic material, such as copper phthalocyanine (CuPc), N,N'-Di(naphthalene-1-yl)-N,N'-diphenyl-benzidine (NPB), tris-8-hydroxyquinoline aluminum (Alq3), or the like.

When the intermediate layer 320 includes a polymer material, the intermediate layer 320 may have a structure including the hole transport layer and the emission layer. The hole transport layer may include poly(3,4-ethylenedioxythiophene) (PEDOT), and the emission layer may include a polymer material such as poly(p-phenylene vinylene) (PPV), polyfluorene, or the like.

The intermediate layer 320 may be formed as a blanket layer covering a plurality of pixel electrodes 310. The present inventive concept is not limited thereto. In an embodiment, the intermediate layer 320 may be provided in plural, and each of a plurality of intermediate layers may be disposed on a corresponding one of the plurality of pixel electrodes 310.

The opposite electrode 330 may be arranged on the intermediate layer 320 to cover the display area DA. For example, the opposite electrode 330 may be formed as a single body to cover all of a plurality of organic light-emitting elements OLED.

The opposite electrode 330 may include a transparent electrode or a semi-transparent electrode.

When the opposite electrode 330 includes the transparent electrode, the opposite electrode 330 may include at least one material selected from Ag, Al, Mg, Li, Ca, Cu, lithium fluoride (LiF)/Ca, LiF/Al, MgAg, and CaAg, and may be formed in a thin-film type having a thickness of several to several tens of micrometers ($\mu$m).

When the opposite electrode 330 includes the semi-transparent electrode, the opposite electrode 330 may include at least one selected from a group including Ag, Al, Mg, Li, Ca, Cu, LiF/Ca, LiF/Al, MgAg, and CaAg. The structure and material of the opposite electrode 330 are not limited thereto, and various modifications may be made.

A spacer 115 may be arranged on the pixel-defining film 113. The spacer 115 may protrude from the pixel-defining film 113 in a direction of the thin-film encapsulation layer 400 and maintain a distance between a deposition mask and the substrate 100 in an operation of depositing the intermediate layer 320 by using the deposition mask to prevent a defect that the intermediate layer 320 is cut or broken by a mask in the deposition operation.

The spacer 115 may include an organic material such as polyimide or HMDSO, or the like. The spacer 115 may be arranged in at least one of first and second dam portions 110 and 120 to be described below to be used for forming a step of the dam portion.

Since the organic light-emitting element OLED may be easily damaged by moisture, oxygen or the like permeated from the outside, the organic light-emitting element OLED may be covered and protected by the thin-film encapsulation layer 400.

The thin-film encapsulation layer 400 may cover the display area DA and extend to the outside of the display area DA. The thin-film encapsulation layer 400 may include at least one organic encapsulation layer and at least one inorganic encapsulation layer. In an embodiment, the thin-film encapsulation layer 400 may include a first inorganic encapsulation layer 410, an organic encapsulation layer 420, and a second inorganic encapsulation layer 430. In an embodiment, the organic encapsulation layer 420 may be interposed between the first inorganic encapsulation layer 410 and the second encapsulation layer 430.

The first inorganic encapsulation layer 410 may entirely cover the opposite electrode 330 and may include silicon oxide, silicon nitride, and/or silicon oxynitride, or the like.

When necessary, other layers such as a capping layer (not shown) may be located between the first inorganic encapsulation layer 410 and the opposite electrode 330. For example, the capping layer may include at least one organic material or inorganic material of silicon oxide ($SiO_2$), silicon nitride ($SiN_x$), zinc oxide ($ZnO_2$), titanium oxide ($TiO_2$), zirconium oxide ($ZrO_2$), indium tin oxide (ITO), indium zinc oxide (IZO), $Alq_3$, CuPc, CBP, a-NPB, and $ZiO_2$ to increase light efficiency. In an embodiment, the capping layer may cause a plasmon resonance phenomenon with respect to light generated by the organic light-emitting element OLED. For example, the capping layer may include nanoparticles. The capping layer may prevent the organic light-emitting element OLED from being damaged by heat, plasma, or the like generated in a chemical vapor deposition operation or a sputtering operation forming the thin-film encapsulation layer 400. For example, the capping layer may include an epoxy-based material including at least one of a bisphenol-type epoxy resin, an epoxidized butadiene resin, a fluorine-type epoxy resin, and a novolac epoxy resin.

In addition, when necessary, a layer (not shown) including LiF or the like may be located between the first inorganic encapsulation layer 410 and the capping layer.

Since the first inorganic encapsulation layer 410 is formed along a step of a structure thereunder, an upper surface of the first inorganic encapsulation layer 410 is not formed flat. The organic encapsulation layer 420 covers and planarizes the first inorganic encapsulation layer 410. An upper surface of the organic encapsulation layer 420 may be substantially flat in a portion corresponding to the display area DA.

The organic encapsulation layer 420 may include polyethylene terephthalate, polyethyelenen napthalate, polycarbonate, polyimide, polyethylene sulfonate, polyoxymethylene, polyarylate, HMDSO, an acrylic resin (for example, polymethyl methacrylate, polyacrylic acid, or the like) or any combination thereof.

The second inorganic encapsulation layer 430 may cover the organic encapsulation layer 420 and may include silicon oxide, silicon nitride, and/or silicon oxynitride, or the like.

The touch-screen layer 700 including the touch electrode 710 is arranged on the thin-film encapsulation layer 400. A cover layer (not shown) protecting the touch-screen layer 700 may be further arranged on the touch-screen layer 700.

The touch-screen layer 700 may include a touch sensor operating using a capacitance method. For example, when the cover layer is touched, a change in mutual capacitance formed between the touch electrodes 710 occurs, and the controller may determine whether a corresponding portion is contacted by sensing the change. Alternatively, a change in capacitance between the touch electrode 710 and the opposite electrode 330 occurs, and the controller may determine whether a contact is made in various methods such as determining whether a corresponding portion is contacted by sensing the change.

The touch-screen layer 700 may include the touch electrode 710 including a first touch conductive layer 711 and a second touch conductive layer 713, a first touch insulating layer 712 between the first touch conductive layer 711 and the second touch conductive layer 713, and a second touch insulating layer 714 arranged on the second touch conductive layer 713.

In some embodiments, the second touch conductive layer 713 may act as a sensor unit that detects whether a contact is made, and the first touch conductive layer 711 may serve as a connection unit connecting, in one direction, the second touch conductive layer 713 which is patterned.

In some embodiments, both of the first touch conductive layer 711 and the second touch conductive layer 713 may serve as a sensor unit. For example, the first touch insulating layer 712 may include a via hole exposing an upper surface of the first touch conductive layer 711, and the first touch conductive layer 711 and the second touch conductive layer 713 may be connected through the via hole. As described above, as the first touch conductive layer 711 and the second touch conductive layer 713 are used, the resistance of the touch electrode 710 may be reduced to increase the response speed of the touch-screen layer 700.

In some embodiments, the touch electrode 710 may be formed to have a mesh structure to allow light emitted from the organic light-emitting element OLED to pass therethrough. Accordingly, the first touch conductive layer 711 and the second touch conductive layer 713 of the touch electrode 710 may be arranged not to overlap an emission area of the organic light-emitting element OLED.

Each of the first touch conductive layer 711 and the second touch conductive layer 713 may include a single-layered film or a multi-layered film including a conductive material having good conductivity. For example, each of the first touch conductive layer 711 and the second touch conductive layer 713 may include a transparent conductive layer, or may include a single-layered film or a multi-layered film including a conductive material including Al. Cu, Ti, or the like. The transparent conductive layer may include a transparent conductive oxide such as ITO, IZO, ZnO, ITZO, or the like. In addition, the transparent conductive layer may include a conductive polymer such as PEDOT, a metal nanowire, graphene, or the like. In some embodiments, each of the first touch conductive layer 711 and the second touch conductive layer 713 may include a stacked structure of Ti/Al/Ti.

Each of the first touch insulating layer 712 and the second touch insulating layer 714 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may include at least one of an acrylic resin, a methacrylic resin, polyisoprene, a vinyl resin, an epoxy resin, a urethane resin, a cellulose resin, and a perylene resin.

Although not illustrated in FIG. 2, a touch buffer layer may be further arranged between the thin-film encapsulation layer 400 and the touch-screen layer 700. The touch buffer layer may be configured to prevent damage to the thin-film encapsulation layer 400 and block interference signals that may occur when the touch-screen layer 700 is driven. The touch buffer layer may include an inorganic material such as silicon oxide, silicon nitride, silicon oxynitride, aluminum oxide, aluminum nitride, titanium oxide, titanium nitride, or the like, or an organic material such as polyimide, polyester, acrylic, or the like, and may include a plurality of laminates of the above-stated materials.

Since the touch buffer layer and/or the touch-screen layer 700 are directly formed on the thin-film encapsulation layer 400 by deposition or the like, a separate adhesive layer is not needed on the thin-film encapsulation layer 400. Accordingly, the thickness of the display apparatus 1 may be reduced.

The cover layer (not shown) may be arranged on the touch-screen layer 700 and may be configured to protect the touch-screen layer 700. The cover layer has a flexible feature, and may include polymethyl methacrylate, polydimethylsiloxane, polyimide, acrylate, polyethylene terephthalate, polyethyelenen napthalate, or the like.

Referring to the non-display area NDA of FIG. 2, the buffer layer 101, the first gate insulating layer 103, the second gate insulating layer 105, the interlayer insulating layer 107, the first planarization film 109, the second planarization film 111 each extending from the display area DA may be arranged.

In an embodiment, the driving voltage supply line 30 and a touch contact line 730 may be arranged on the first planarization film 109. The driving voltage supply line 30 and the touch contact line 730 may include the same material as that of the driving voltage line PL.

Although FIG. 2 illustrates that the driving voltage supply line 30 and the touch contact line 730 are located on the first planarization film 109, the present disclosure is not limited thereto. At least one of the driving voltage supply line 30 and the touch contact line 730 may be located below the first planarization film 109 or above the second planarization film 111. For example, the at least one of the driving voltage supply line 30 and the touch contact line 730 may include the same material as that of a data line DL and be located on the same layer as that of the data line DL, or may include the same material as that of the pixel electrode 310 and be located on the same layer as that of the pixel electrode 310.

A first dam portion 110 and a second dam portion 120 may be sequentially arranged in the non-display area NDA at a position overlapping the driving voltage supply line 30 in a direction of an end portion of the substrate 100. A portion of the first inorganic encapsulation layer 410 and a portion of the second inorganic encapsulation layer 420 may meet each other on an upper surface of the first dam portion 110. For example, the portion of the first inorganic encapsulation layer 410 may be in contact with the upper surface of the first dam 110, and the portion of the second inorganic encapsulation layer 420 may be in contact with the portion of the first inorganic encapsulation layer 410. The portion of the first inorganic encapsulation layer 410 may be disposed between the upper surface of the first dam portion 110 and the portion of the second inorganic encapsulation layer 420.

The first dam portion 110 may include a first layer 111a including the same material as that of the second planarization film 111 and a second layer 113a including the same material as that of the pixel-defining film 113. The second layer 113a of the first dam portion 110 may clad an upper surface and side surfaces of the first layer 111a to secure an operation margin during patterning of the second layer 113a in a photolithography operation, and thus the height of the second layer 113a may be stably secured.

The second dam portion 120 may include a first layer 111b including the same material as that of the second planarization film 111, a second layer 113b including the same material as that of the pixel-defining film 113, and a third layer 115b including the same material as that of the spacer 115. The second layer 113b of the second dam portion 120 may clad an upper surface and side surfaces of the first layer 111b to secure an operation margin during patterning of the second layer 113b in a photolithography operation, and thus the height of the second layer 113b may be stably secured. Since the second layer 113b and the third layer 115b of the second dam portion 120 may be formed by a patterning process using the same mask, the width of an upper surface of the second layer 113b and the width of a lower surface of the third layer 115b may be formed substantially the same.

The height of the second dam portion 120 may be formed higher than that of the first dam portion 110 to prevent the organic encapsulation layer 420 from crossing the second dam portion 120 and forming an edge tail, and to maintain a distance between a mask and the substrate 100 in an operation of performing deposition on the intermediate layer 320 by using the mask to prevent the intermediate layer 320 from being cut or broken by the deposition mask in the deposition operation.

The first layer 111b of the second dam portion 120 may clad an end portion of the driving voltage supply line 30 to prevent the driving voltage supply line 30 from being damaged during a wet etching of the second planarization film 111.

The first inorganic encapsulation layer 410 and the second inorganic encapsulation layer 430 extending from the display area DA are arranged to extend to the outside of the second dam portion 120, and the touch contact line 730 is located outside the second dam portion 120.

The second inorganic encapsulation layer 430 is deposited to be in direct contact with the first inorganic encapsulation layer 410 outside the display area DA, such that the organic encapsulation layer 420 may be sealed so as not to be exposed to the outside of the first and second encapsulation layers 410 and 430.

The touch contact line 730 is in contact with the second touch connection line 720 extending from the second touch conductive layer 713 through a first touch contact hole CNT1 formed in the first touch insulating layer 712 extending from the display area DA. The touch contact line 730 may be connected to the controller through the second terminal 22 (see FIG. 1).

In the present embodiment, an end portion E2 of the second inorganic encapsulation layer 430 is located closer to the touch contact line 730 than an end portion E1 of the first inorganic encapsulation layer 410 is. Alternatively, a length L410-1 from an end portion E0 of the second dam portion 120 to the end portion E1 of the first inorganic encapsulation layer 410 is less than a length L430-1 from the end portion E0 of the second dam portion 120 to the end portion E2 of the second inorganic encapsulation layer 430.

As a result, the end portion E2 of the second inorganic encapsulation layer 430, which is an outermost end portion of the thin-film encapsulation layer 400, may be spaced apart from an end portion E3 of the touch contact line 730 by a first distance D1. The end portion E3 may be closer to the display area DA than the opposite end portion of the touch contact line 730 is.

Hereinafter, differences between a display apparatus 2 according to a comparative embodiment and the display apparatus 1 according to the present embodiment will be described below with reference to FIGS. 3 and 4.

Figure 3:
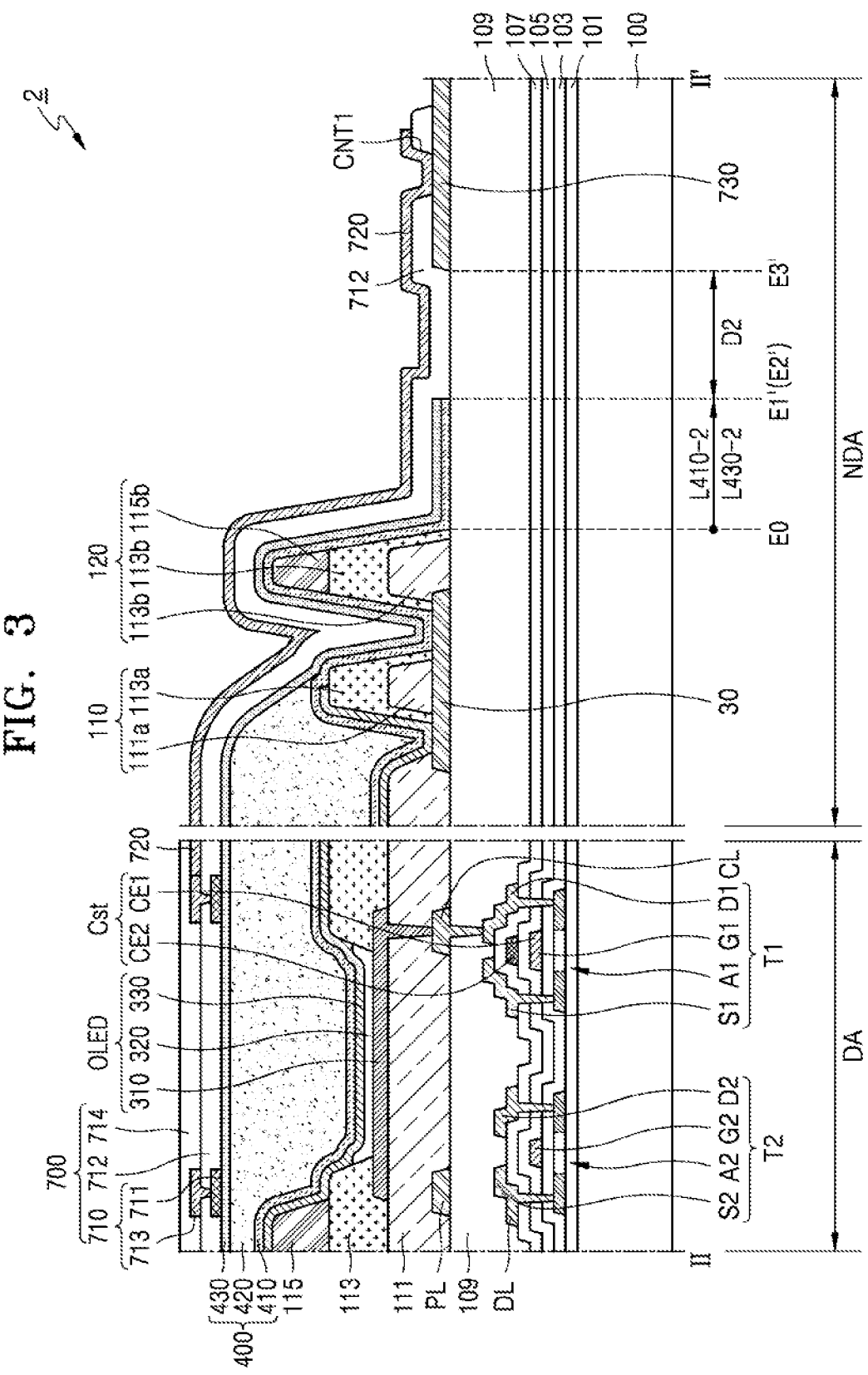
FIG. 3 is a schematic cross-sectional view of a display apparatus according to a comparative embodiment.
Figure 4:
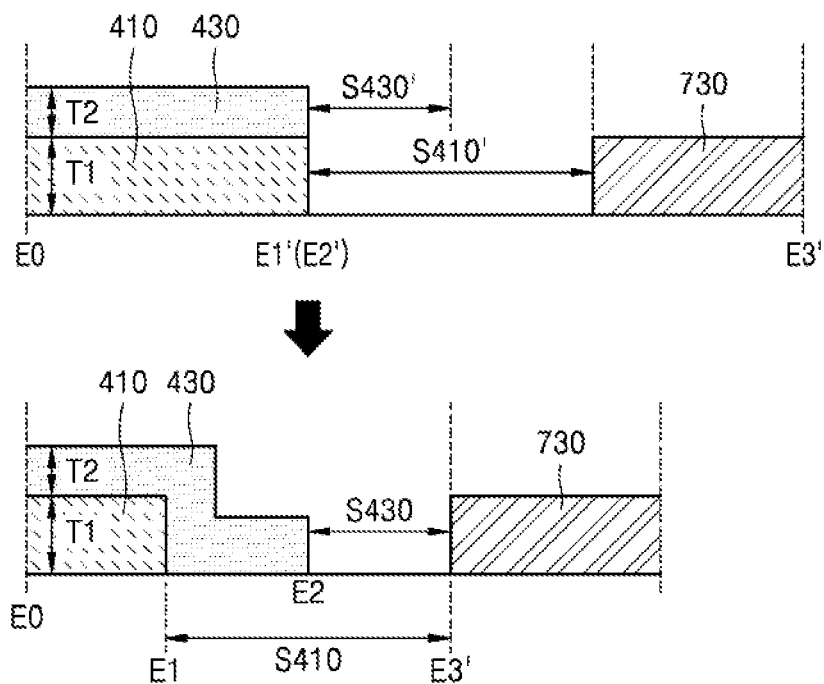
FIG. 4 is a cross-sectional view comparing a positional relationship between first and second thin-film transistors and a touch contact line of FIGS. 2 and 3 according to an exemplary embodiment of the present inventive concept.

FIG. 3 is a schematic cross-sectional view of the display apparatus 2 according to a comparative embodiment, and FIG. 4 is a cross-sectional view comparing a positional relationship between the first and second inorganic encapsulation layers 410 and 430 and the touch contact line 730 of FIGS. 2 and 3.

Referring to FIG. 3, unlike the display apparatus 1 of FIG. 2, in the display apparatus 2 according to the comparative embodiment, end portions of the first inorganic encapsulation layer 410 and the second inorganic encapsulation layer 430 have the same length. For example, the end portion of the first inorganic encapsulation layer 410 may not be covered with the end portion of the second inorganic encapsulation layer 430.

In the display apparatus 2 of FIG. 3, the first inorganic encapsulation layer 410 and the second inorganic encapsulation layer 430 are formed in the same size. For example, an end portion E2' of the second inorganic encapsulation layer 430 and an end portion E1' of the first inorganic encapsulation layer 410 are located at the same distance from the touch contact line 730. Alternatively, a length L410-2 from the end portion E0 of the second dam portion 120 to the end portion E1' of the first inorganic encapsulation layer 410 is equal to a length L430-2 from the end portion E0 of the second dam portion 120 and the end portion E2' of the second inorganic encapsulation layer 430.

As a result, the end portions E1' and E2' of the first and second inorganic encapsulation layers 410 and 430, which are the outermost end portions of the thin-film encapsulation layer 400, may be spaced apart from an end portion E3' of the touch contact line 730 by the same distance such as a second distance D2. The end portion E3' may be closer to the display area DA than the opposite end of the touch contact line 730 is.

The first distance D1 of FIG. 2 according to the present embodiment is formed to be less than the second distance D2 of FIG. 3 according to the comparative embodiment. As the first distance D1 is formed to be less than the second distance D2, a dead space in the non-display area NDA may be reduced in the present embodiment than that of the comparative embodiment.

An upper drawing of FIG. 4 is a cross-sectional view of a positional relationship between the first and second inorganic encapsulation layers 410 and 430 and the touch contact line 730 of FIG. 3 according to the comparative embodiment, and a lower drawing of FIG. 4 is a cross-sectional view of a positional relationship between the first and second inorganic encapsulation layers 410 and 430 and the touch contact line 730 of 2 according to the present embodiment.

The comparative embodiment of the upper end of FIG. 4 illustrates a case that the first inorganic encapsulation layer 410 and the second inorganic encapsulation layer 430 have the same length, but a first thickness T1 of the first inorganic encapsulation layer 410 is formed larger than a second thickness T2 of the second inorganic encapsulation layer 430.

When the first and second inorganic encapsulation layers 410 and 430 are formed by a chemical vapor deposition operation using a shadow mask, a deposition material may be deposited in a shadow area outside a target area due to a shadow phenomenon. The phenomenon tends to increase the shadow area as the thickness of the deposition material increases.

When the first inorganic encapsulation layer 410 is formed thicker than the second inorganic encapsulation layer 430, a first shadow area S410' of the first inorganic encapsulation layer 410 is formed larger than a second shadow area S430' of the second inorganic encapsulation layer 430.

Since the touch contact line 730 is formed at a position outside the shadow areas, according to the comparative embodiment, the end portion E3' of the touch contact line 730 closer to the display area DA may be formed at a position where the first shadow area S410' ends.

The present embodiment of the lower end of FIG. 4 illustrates a case that the length of the first inorganic encapsulation layer 410 including a larger thickness is formed less than the length of the second inorganic encapsulation layer 430 in a state where the first thickness T1 of the first inorganic encapsulation layer 410 and the second thickness T2 of the second inorganic encapsulation layer 430 are maintained in the same manner as in the comparative embodiment of the upper end of FIG. 4.

Since the first and second thicknesses T1 and T2 of the first and second inorganic encapsulation layers 410 and 430 of the present embodiment are the same as those of the comparative embodiment, areas of first and second shadow areas S410 and S430 of the present embodiment are substantially the same as areas of the first and second shadow areas S410' and S430' of the comparative embodiment. However, in the present embodiment, since the length of the first inorganic encapsulation layer 410 including a larger thickness is formed short, a start line of the first shadow area S410 is moved to the end portion E1 of the first inorganic encapsulation layer 410. For example, the start line of the first shadow area S410 is shifted in a direction closer to the display area DA, the end portion E3 of the touch contact line 730, the end portion E3 being close to the display area DA, may be moved toward the display area DA side. As a result, when other conditions are the same, in the display apparatus 1 of the present embodiment, the dead space may be reduced compared with the display apparatus 2 of the comparative embodiment.

Although the length of the first inorganic encapsulation layer 410 is reduced, since the first touch insulating layer 712 and second touch connection line 720 both extending from the display area DA cover the end portions E1 and E2 of the first inorganic encapsulation layer 410 and the second inorganic encapsulation layer 430, the penetration of external impurities may be prevented.

In addition, since the first inorganic encapsulation layer 410 is formed to be shorter than the second inorganic encapsulation layer 430, organic materials remaining outside the first inorganic encapsulation layer 410 after patterning the second planarization film 111, the pixel-defining film 113, and the spacer 115 may be easily removed in an ashing process using nitrogen oxide ($N_2O$) or the like, the ashing process being performed after the first inorganic encapsulation layer 410 is formed. Accordingly, the penetration of the remaining organic materials into the thin-film encapsulation layer 400 may be prevented.

Figure 5:
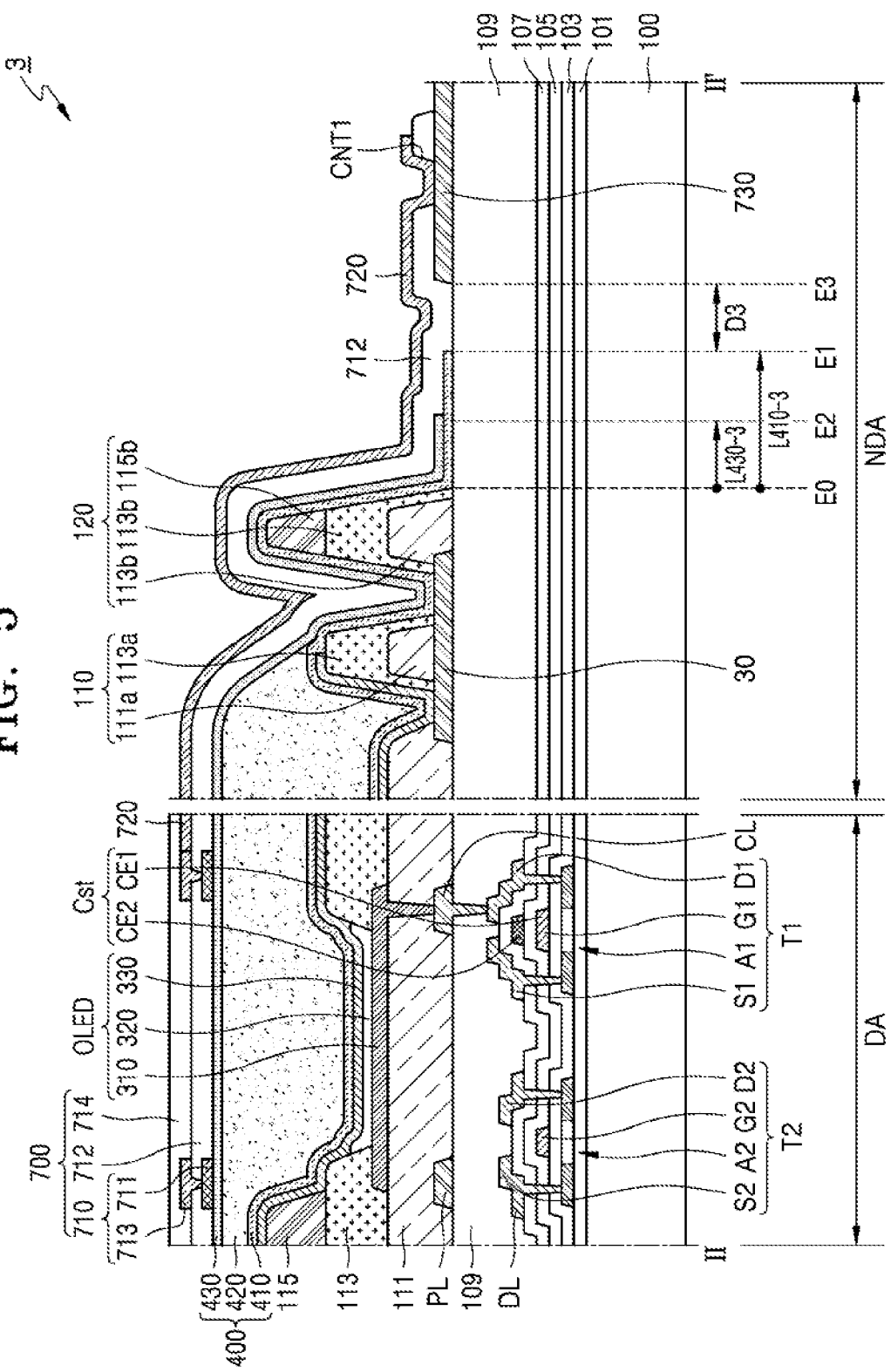
FIG. 5 is a schematic cross-sectional view of a display apparatus according to an exemplary embodiment of the present inventive concept.

FIG. 5 is a schematic cross-sectional view of a display apparatus 3 according to an embodiment. Hereinafter, an embodiment of FIG. 5 will be described below based on differences from the embodiment of FIG. 2.

Referring to FIG. 5, unlike the embodiment of FIG. 2, the end portion E1 of the first inorganic encapsulation layer 410 is located closer to the touch contact line 730, than the end portion E2 of the second inorganic encapsulation layer 430 is. Alternatively, a length L430-3 from the end portion E0 of the second dam portion 120 to the end portion E2 of the second inorganic encapsulation layer 430 is less than a length L410-3 from the end portion E0 of the second dam portion 120 to the end portion E1 of the first inorganic encapsulation layer 410.

Although not illustrated in FIG. 5 in detail, unlike the embodiment of FIG. 2, the thickness of the second inorganic encapsulation layer 430 is greater than the thickness of the first inorganic encapsulation layer 410 in the present embodiment. A shadow area by the second inorganic encapsulation layer 430 may be shifted toward a side of the display area DA by forming the second inorganic encapsulation layer 430 to have a greater thickness than the first inorganic encapsulation layer 430 and to be shorter in length than the first inorganic encapsulation layer 430. For example, an end portion of the second encapsulation layer 430 may be more distant from an end of the touch contact line 730 than an end portion of the first encapsulation layer 410 is.

Accordingly, the end portion E1 of the first inorganic encapsulation layer 410, which is an outermost end portion of the thin-film encapsulation layer 400, may be spaced apart from the end portion E3 of the touch contact line 730 by a third distance D3. The end portion E3 may be closer to the display area DA than the opposite end of the touch contact line 730 is. As the third distance D3 of the present embodiment is formed to be less than the second distance D2 of the comparative embodiment, a dead space in the non-display area NDA may be reduced in the present embodiment than that of the comparative embodiment.

In addition, although the length of the second inorganic encapsulation layer 430 is reduced, since the first touch insulating layer 712 and second touch connection line 720 both extending from the display area DA cover the end portions E1 and E2 of the first inorganic encapsulation layer 410 and the second inorganic encapsulation layer 430, the penetration of external impurities may be prevented.

When the length L430-3 of the second inorganic encapsulation layer 430 of the present embodiment is equal to the length L410-1 of the first inorganic encapsulation layer 410 of FIG. 2, the length L410-3 of the first inorganic encapsulation layer 410 of the present embodiment is equal to the length L430-1 of the second inorganic encapsulation layer 430 of FIG. 2, the thickness of the second inorganic encapsulation layer 430 of the present embodiment is equal to the thickness of the first inorganic encapsulation layer 410 of FIG. 2, and the thickness of the first inorganic encapsulation layer 410 of the present embodiment is equal to the thickness of the second inorganic encapsulation layer 430 of FIG. 2, the third distance D3 of the present embodiment may be substantially the same as the first distance D1 of FIG. 2.

Figure 6:
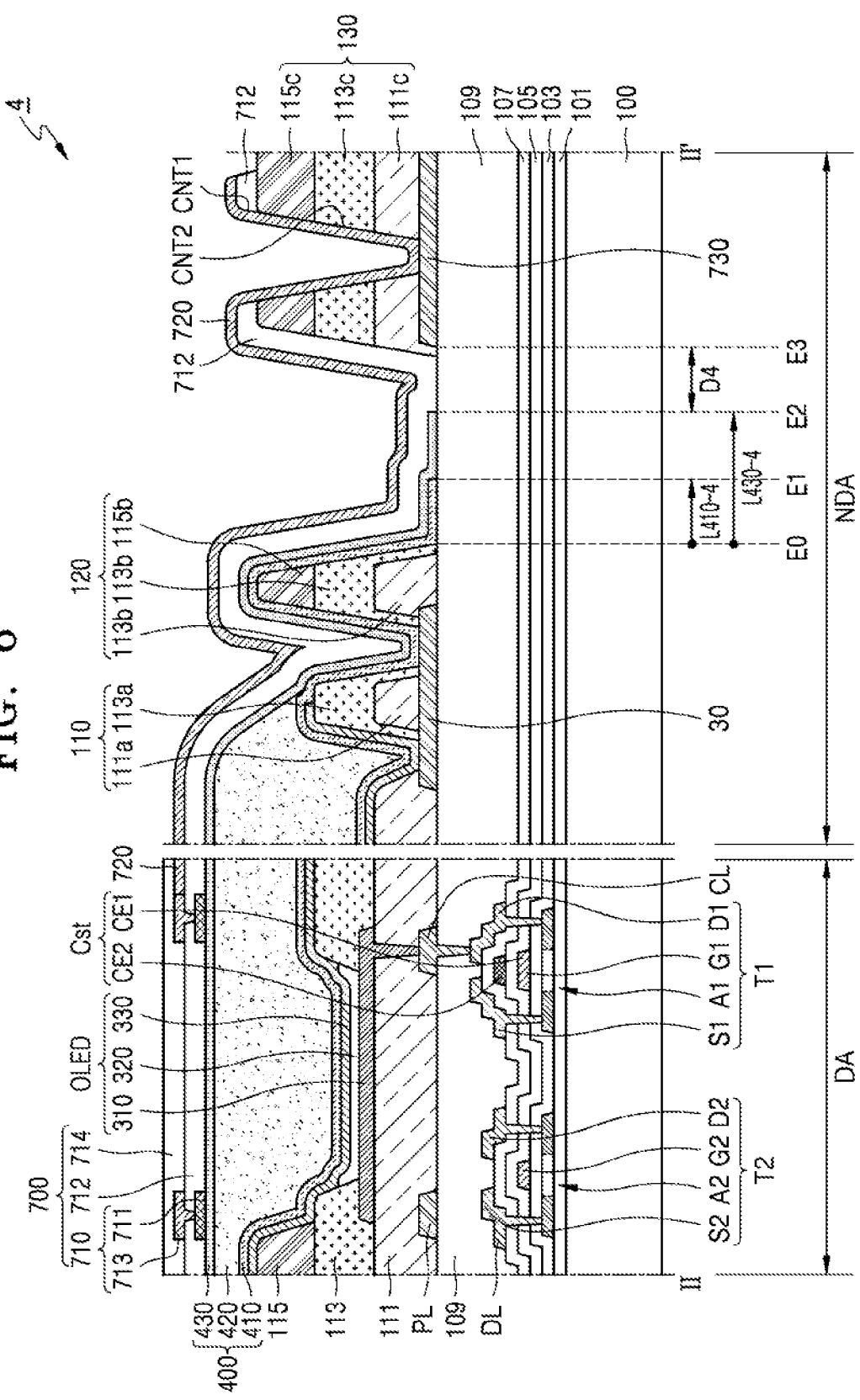
FIG. 6 is a schematic cross-sectional view of a display apparatus according to an exemplary embodiment of the present inventive concept.

FIG. 6 is a schematic cross-sectional view of a display apparatus 4 according to an embodiment. Hereinafter, an embodiment of FIG. 6 will be described below based on differences from the embodiment of FIG. 2.

Referring to FIG. 6, unlike the embodiment of FIG. 2, in the present embodiment, an insulating layer formed between the second touch connection line 720 and the touch contact line 730 further includes an organic insulating layer 130 in addition to the first touch insulating layer 712.

In an embodiment, the organic insulating layer 130 may include a first layer 111c including the same material as that of the second planarization film 111, a second layer 113c including the same material as that of the pixel-defining film 113, and a third layer 115c including the same material as that of the spacer 115. The first layer 111c, the second layer 113c, and the third layer 115c may include an organic insulating material. The present inventive concept is not limited thereto. In an embodiment, the organic insulating layer 130 may include at least one of the first layer 111c, the second layer 113c, and the third layer 115c.

The second touch connection line 720 may be in contact with the touch contact line 730 through the first touch contact hole CNT1 formed in the first touch insulating layer 712 and a second touch contact hole CNT2 formed in the organic insulating layer 130.

A length L410-4 of the first inorganic encapsulation layer 410 and a length L430-4 of the second inorganic encapsulation layer 430 of the present embodiment may be formed to be equal to the length L410-1 of the first inorganic encapsulation layer 410 and the length L430-1 of the second inorganic encapsulation layer 430 of the embodiment of FIG. 2, respectively. The thickness of the first inorganic encapsulation layer 410 and the thickness of the second inorganic encapsulation layer 430 of the present embodiment may be formed to be equal to the thickness of the first inorganic encapsulation layer 410 and the thickness of the second inorganic encapsulation layer 430 of the embodiment of FIG. 2, respectively. Accordingly, the fourth distance D4 of the present embodiment may be substantially the same as the first distance D1 of FIG. 2, and the fourth distance D4 of the present embodiment may be formed to be less than the second distance D2 of the comparative embodiment, such that a dead space in the non-display area NDA may be reduced in the present embodiment than that of the comparative embodiment.

However, the present embodiment may also be applied when the lengths and thicknesses of the first inorganic encapsulation layer 410 and the second inorganic encapsulation layer 430 are different from the lengths and thicknesses of the first inorganic encapsulation layer 410 and the second inorganic encapsulation layer 430 of the embodiment of FIG. 2.

Figure 7:
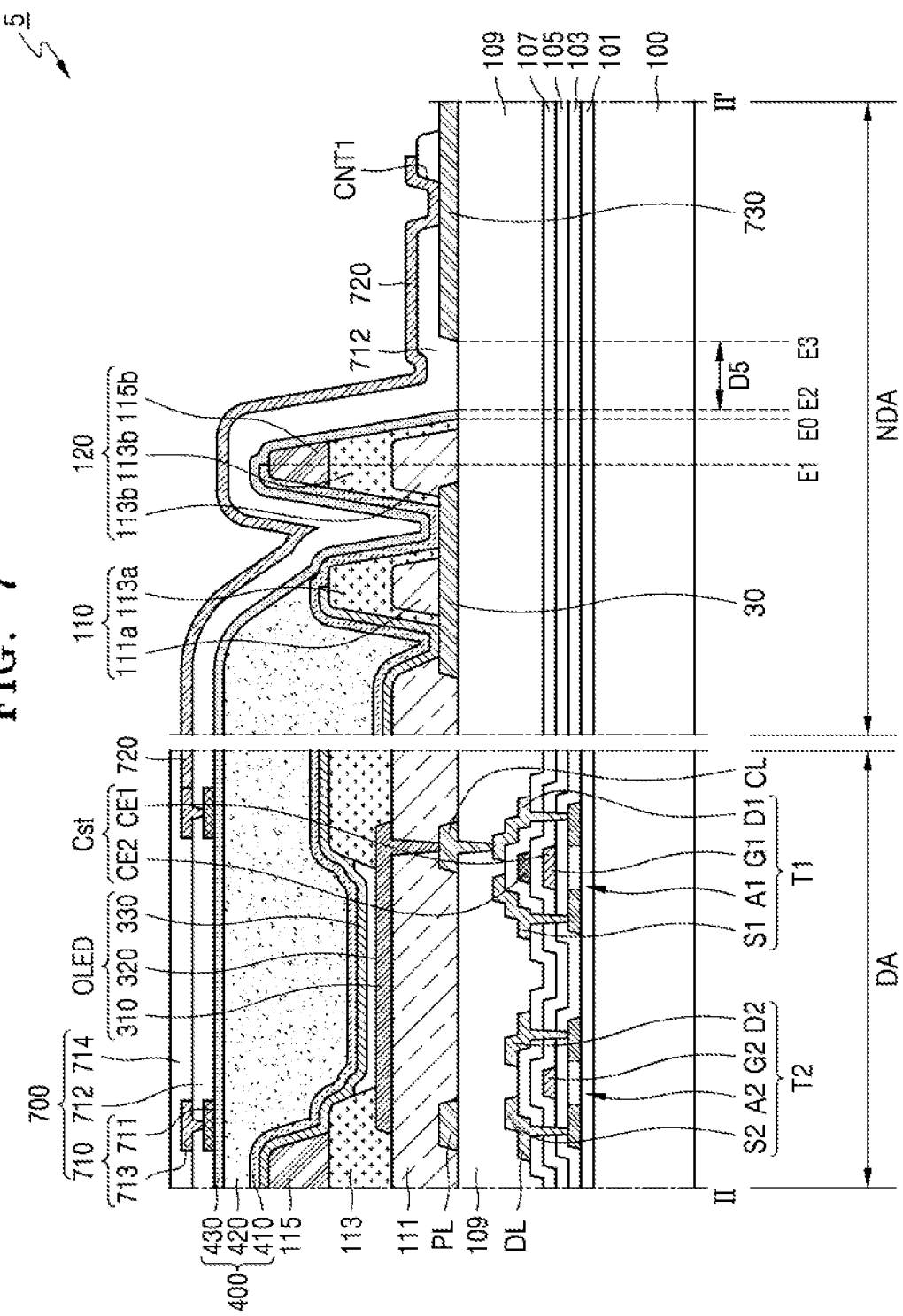
FIG. 7 is a schematic cross-sectional view of a display apparatus according to an exemplary embodiment of the present inventive concept.

FIG. 7 is a schematic cross-sectional view of a display apparatus 5 according to an embodiment. Hereinafter, an embodiment of FIG. 7 will be described below based on differences from the embodiment of FIG. 2.

Referring to FIG. 7, unlike the embodiment of FIG. 2, the end portion E1 of the first inorganic encapsulation layer 410 is located inside the end portion E0 of the second dam portion 120 in the present embodiment. The end portion E2 of the second inorganic encapsulation layer 430 may substantially coincide with the end portion E0 of the second dam portion 120.

Compared with the embodiment of FIG. 2, in the present embodiment, the end portion E1 of the first inorganic encapsulation layer 410 and the end portion E2 of the second inorganic encapsulation layer 430 may be shifted toward the display area DA, and a shadow area of the first inorganic encapsulation layer 410 and the second inorganic encapsulation layer 430 may be shifted toward the display area DA. The end portion E1 of the first inorganic encapsulation layer 410 may disposed on an upper surface of the second dam portion 120. The second inorganic encapsulation layer 430 may extend to cover the end portion E1 of the first inorganic encapsulation layer 410 and a sidewall of the second dam portion 120. The end portion E2 of the second inorganic encapsulation layer 430 may be in contact with an upper surface of the first planarization film 109 without further extending beyond the contact therebetween toward the touch contact line 730.

Accordingly, the end portion E2 of the second inorganic encapsulation layer 430, which is an outermost end portion of the thin-film encapsulation layer 400, may be spaced apart from the end portion E3 of the touch contact line 730 by a fifth distance D5. The end portion E3 may be closes to the display area DA than the opposite end of the touch contact line 730 is. As the fifth distance D5 of the present embodiment is formed to be less than the second distance D2, a dead space in the non-display area NDA may be reduced in the present embodiment than that of the comparative embodiment.

In addition, since the first inorganic encapsulation layer 410 is formed to be shorter than the second inorganic encapsulation layer 430, organic materials remaining outside the first inorganic encapsulation layer 410 after patterning the second planarization film 111, the pixel-defining film 113, and the spacer 115 may be easily removed in an ashing process using nitrogen oxide (N2O) or the like, the ashing process being performed after the first inorganic encapsulation layer 410 is formed. Accordingly, the penetration of the remaining organic materials into the thin-film encapsulation layer 400 may be prevented.

Figure 8:
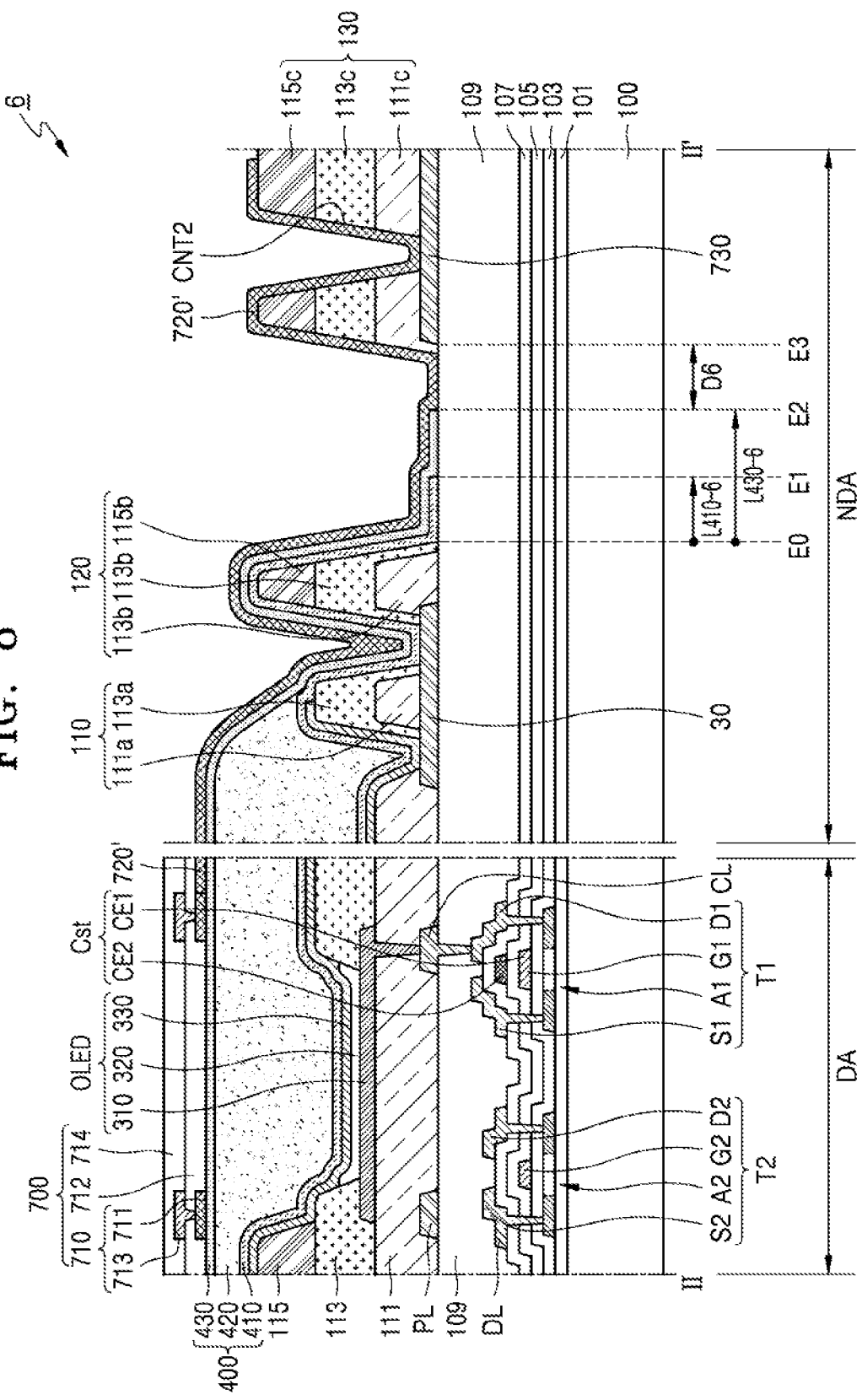
FIG. 8 is a schematic cross-sectional view of a display apparatus according to an exemplary embodiment of the present inventive concept.

FIG. 8 is a schematic cross-sectional view of a display apparatus 6 according to an embodiment. Hereinafter, an embodiment of FIG. 8 will be described below based on differences from the embodiment of FIG. 2.

Referring to FIG. 8, unlike the embodiment of FIG. 2, in the present embodiment, a first touch connection line 720' extending from the first touch conductive layer 711 is in contact with the touch contact line 730.

Since the first touch connection line 720' extends from the first touch conductive layer 711, instead of the forming a touch contact hole in the first touch insulating layer 712, the organic insulating layer 130 may be located between the first touch connection line 720' and the touch contact line 730, and the first touch connection line 720' may be in contact with the touch contact line 730 through the second touch contact hole CNT2 formed in the organic insulating layer 130.

As described in the embodiment of FIG. 6, the organic insulating layer 130 may include the first layer 111c including the same material as that of the second planarization film 111, the second layer 113c including the same material as that of the pixel-defining film 113, and the third layer 115c including the same material as that of the spacer 115. In an embodiment, the organic insulating layer 130 may include at least one of the first layer 111c, the second layer 113c, and the third layer 115c.

A length L410-6 of the first inorganic encapsulation layer 410 and a length L430-6 of the second inorganic encapsulation layer 430 of the present embodiment may be formed to be equal to the length L410-1 of the first inorganic encapsulation layer 410 and the length L430-1 of the second inorganic encapsulation layer 430 of the embodiment of FIG. 2, and the thickness of the first inorganic encapsulation layer 410 and the thickness of the second inorganic encapsulation layer 430 of the present embodiment may be formed to be equal to the thickness of the first inorganic encapsulation layer 410 and the thickness of the second inorganic encapsulation layer 430 of the embodiment of FIG. 2. Accordingly, a sixth distance D6 of the present embodiment may be substantially the same as the first distance D1 of FIG. 2, and the sixth distance D6 of the present embodiment may be formed to be less than the second distance D2 of the comparative embodiment, such that a dead space in the non-display area NDA may be reduced in the present embodiment than that of the comparative embodiment.

However, the present embodiment may also be applied when the lengths and thicknesses of the first inorganic encapsulation layer 410 and the second inorganic encapsulation layer 430 are different from the lengths and thicknesses of the first inorganic encapsulation layer 410 and the second inorganic encapsulation layer 430 of the embodiment of FIG. 2.

Figure 9:
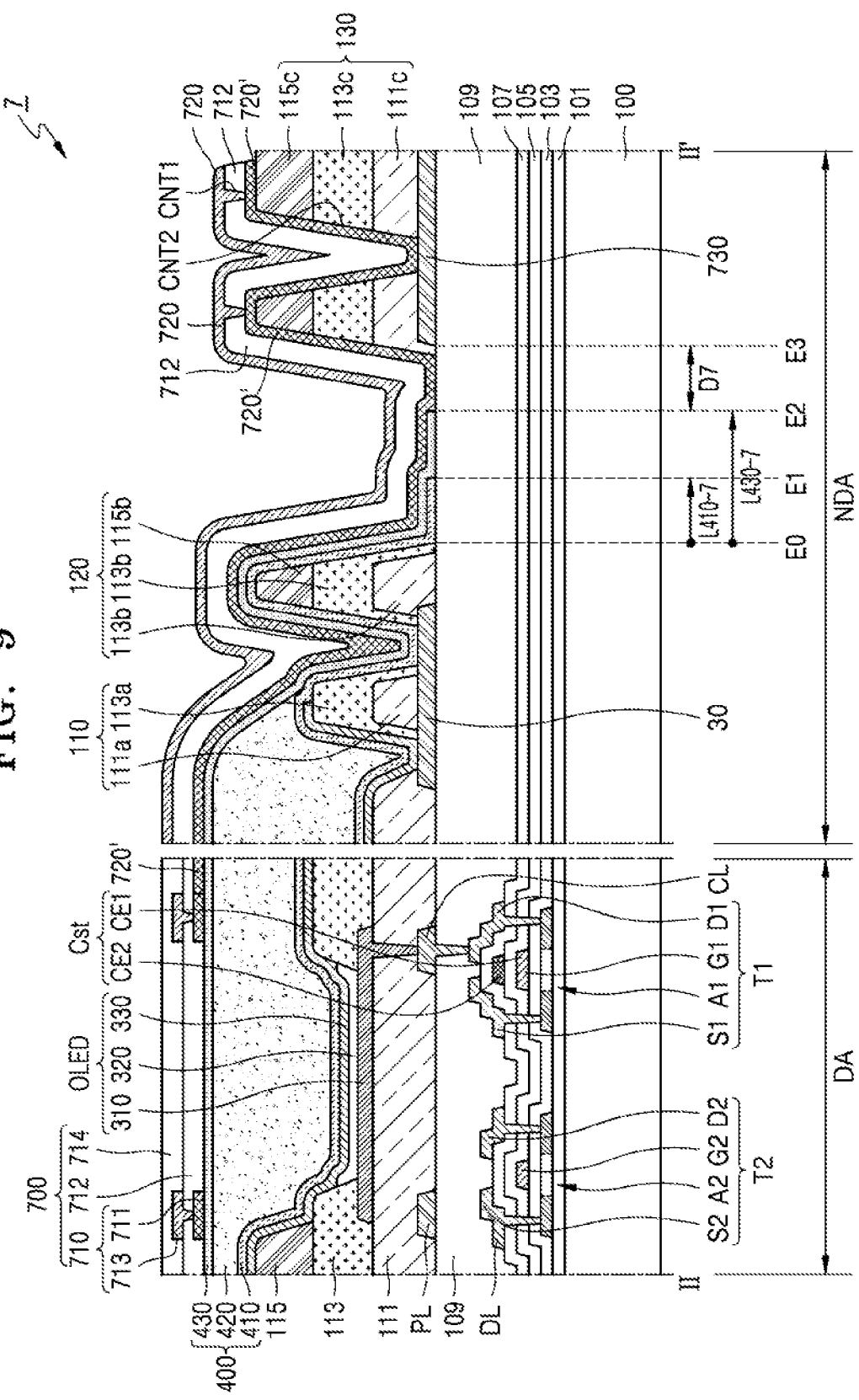
FIG. 9 is a schematic cross-sectional view of a display apparatus according to an exemplary embodiment of the present inventive concept.

FIG. 9 is a schematic cross-sectional view of a display apparatus 7 according to an embodiment. Hereinafter, an embodiment of FIG. 9 will be described below based on differences from the embodiment of FIG. 2.

Referring to FIG. 9, unlike the embodiment of FIG. 2, in the present embodiment, the second touch connection line 720 extending from the second touch conductive layer 713 and the first touch connection line 720' extending from the first touch conductive layer 711 are in contact with the touch contact line 730. For example, the first touch connection line 720' may extend from the first touch conductive layer 711 toward a second touch contact hole CNT2 to be in contact with 730 exposed by the second touch contact hole CNT2. The second touch connection line 720 may extend from the second touch conductive layer 713 toward the second touch contact hole CNT2 to be in contact with the first touch connection line 720' via a first touch contact hole CNT1.

In the present embodiment, the first touch insulating layer 712 is located between the first touch connection line 720' and the second touch connection line 720, and the organic insulating layer 130 is further located between the touch contact line 730 and the first touch connection line 720'.

The first touch connection line 720' is in contact with the second touch connection line 720 through the first touch contact hole CNT1 formed in the first touch insulating layer 712, and the first touch connection line 720' is in contact with the touch contact line 730 through the second touch contact hole CNT2 formed in the organic insulating layer 130. A stacked structure of the first touch connection line 720' and the second touch connection line 720 may increase the touch sensitivity by reducing the resistance of the touch-screen layer 700.

In the present embodiment, as described in the embodiment of FIG. 6, the organic insulating layer 130 may include the first layer 111c including the same material as that of the second planarization film 111, the second layer 113c including the same material as that of the pixel-defining film 113, and the third layer 115c including the same material as that of the spacer 115. The present inventive concept is not limited thereto. In an embodiment, the organic insulating layer 130 may include at least one of the first layer 111c, the second layer 113c, and the third layer 115c.

A length L410-7 of the first inorganic encapsulation layer 410 and a length L430-7 of the second inorganic encapsulation layer 430 of the present embodiment may be formed to be equal to the length L410-1 of the first inorganic encapsulation layer 410 and the length L430-1 of the second inorganic encapsulation layer 430 of the embodiment of FIG. 2, respectively. The thickness of the first inorganic encapsulation layer 410 and the thickness of the second inorganic encapsulation layer 430 of the present embodiment may be formed to be equal to the thickness of the first inorganic encapsulation layer 410 and the thickness of the second inorganic encapsulation layer 430 of the embodiment of FIG. 2, respectively. Accordingly, a seventh distance D7 of the present embodiment may be substantially the same as the first distance D1 of FIG. 2, and the seventh distance D7 of the present embodiment may be formed to be less than the second distance D2 of the comparative embodiment, such that a dead space in the non-display area NDA may be reduced in the present embodiment than that of the comparative embodiment.

However, the present embodiment may also be applied when the lengths and thicknesses of the first inorganic encapsulation layer 410 and the second inorganic encapsulation layer 430 are different from the lengths and thicknesses of the first inorganic encapsulation layer 410 and the second inorganic encapsulation layer 430 of the embodiment of FIG. 2.

According to the embodiments, a dead space may be reduced. The scope of the present disclosure is limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus, the apparatus comprising:
a thin-film encapsulation layer covering a pixel on a substrate,
wherein the thin-film encapsulation layer comprises a first inorganic encapsulation layer, an organic encapsulation layer, and a second inorganic encapsulation layer, and
wherein the first inorganic encapsulation layer and the second inorganic encapsulation layer have different lengths from each other;
a touch electrode located on the thin-film encapsulation layer;

a touch contact line spaced apart from the thin-film encapsulation layer and located outside the thin-film encapsulation layer;
an insulating layer located on the touch contact line;
a touch contact hole formed in the insulating layer and spaced apart from the thin-film encapsulation layer;
a touch connection line extending from the touch electrode toward the touch contact hole and connected to the touch contact line through the touch contact hole,
a first touch insulating layer and a second touch insulating layer,
wherein the second touch insulating layer is disposed on a first portion of the first touch insulating layer,
wherein the touch electrode comprises a first touch conductive layer and a second touch conductive layer,
wherein the first portion of the first touch insulating layer is disposed between the first touch conductive layer and the second touch conductive layer,
wherein a second portion of the first touch insulating layer is disposed between the touch contact line and the touch connection line, and
wherein the second touch insulating layer is disposed on the second touch conductive layer.

2. The display apparatus of claim 1,
wherein an end portion of the second inorganic encapsulation layer is located closer to the touch contact line than an end portion of the first inorganic encapsulation layer.

3. The display apparatus of claim 2,
wherein the first inorganic encapsulation layer is thicker than the second inorganic encapsulation layer.

4. The display apparatus of claim 1,
wherein an end portion of the first inorganic encapsulation layer is located closer to the touch contact line than an end portion of the second inorganic encapsulation layer.

5. The display apparatus of claim 4,
wherein the second inorganic encapsulation layer is thicker than the first inorganic encapsulation layer.

6. The display apparatus of claim 1,
wherein the insulating layer extends from the first touch insulating layer.

7. The display apparatus of claim 6,
wherein the first touch insulating layer comprises an inorganic insulating material.

8. The display apparatus of claim 1,
wherein the touch connection line extends from the second touch conductive layer toward the touch contact hole so that the touch connection line is in contact with the touch contact line.

9. The display apparatus of claim 1,
wherein the touch connection line extends from the first touch conductive layer toward the touch contact hole so that the touch connection line is in contact with the touch contact line.

10. The display apparatus of claim 1,
wherein the touch connection line comprises:
a first touch connection line extending from the first touch conductive layer toward the touch contact hole so that the touch connection line is in contact with the touch contact line; and
a second touch connection line extending from the second touch conductive layer toward the touch contact hole, and
wherein the first touch insulating layer is interposed between the first touch connection line and the second touch connection line.

11. The display apparatus of claim 1, further comprising:
a transistor on the substrate;
a planarization film covering the transistor and the substrate,
wherein the planarization film comprises an organic insulating material; and
a pixel-defining film located on the planarization film and comprising an organic insulating material,
wherein the pixel-defining film is disposed between the planarization film and the thin-film encapsulation layer, and
wherein the insulating layer comprises the same material as that of the planarization film and the pixel-defining film.

12. The display apparatus of claim 1,
wherein the touch connection line covers upper surfaces and end portions of the first inorganic encapsulation layer and the second inorganic encapsulation layer.

13. The display apparatus of claim 1, further comprising:
a driving voltage line electrically connected to the pixel;
a first dam portion positioned to overlap the driving voltage line; and
a second dam portion partially overlapping the driving voltage line,
wherein the second dam portion is disposed between the first dam portion and the touch contact line.

14. The display apparatus of claim 13,
wherein an end portion of the first inorganic encapsulation layer is located on an upper surface of the second dam portion and an end portion of the second inorganic encapsulation layer is located between a sidewall of the second dam portion and the touch contact line.

15. The display apparatus of claim 13,
wherein end portions of the first inorganic encapsulation layer and the second inorganic encapsulation layer are located between the second dam portion and the touch contact line.

* * * * *